United States Patent [19]

Knubbe et al.

[11] 3,900,821

[45] Aug. 19, 1975

[54] INTEGRATED FREQUENCY SELECTIVE DEMODULATION CIRCUIT

[75] Inventors: Keith Knubbe, Cupertino; Werner H. Hoeft, San Jose; Gary Kelson, Santa Clara, all of Calif.

[73] Assignee: Signetics Corporation, Sunnyvale, Calif.

[22] Filed: Dec. 17, 1973

[21] Appl. No.: 425,216

[52] U.S. Cl. .................... 329/122; 325/346; 331/23
[51] Int. Cl.$^2$ .............................................. H03D 3/24
[58] Field of Search .................... 329/122, 123–125; 325/346, 419; 331/23, 25, 18

[56] References Cited

UNITED STATES PATENTS

| | | | |
|---|---|---|---|
| 3,346,815 | 10/1967 | Haggai | 329/122 |
| 3,743,941 | 7/1973 | Gans et al. | 329/122 X |
| 3,794,928 | 2/1974 | Stump et al. | 329/122 X |

*Primary Examiner*—Alfred L. Brody
*Attorney, Agent, or Firm*—Flehr, Hohbach, Test, Albritton & Herbert

[57] ABSTRACT

A circuit for use in demodulating a FM input signal with fixed carrier frequency includes a first mixer driven by a crystal controlled oscillator which provides a difference signal which is demodulated by a phase locked loop. The phase locked loop operates at a frequency significantly below that of the input signal carrier frequency.

3 Claims, 5 Drawing Figures

FIG. 2

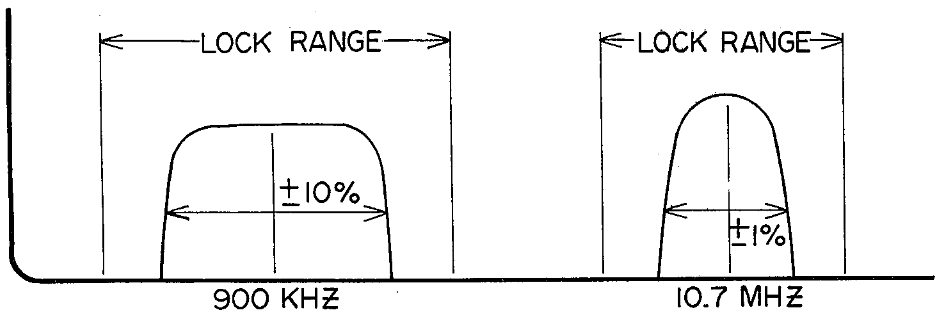
FIG. 4
FIG. 5A
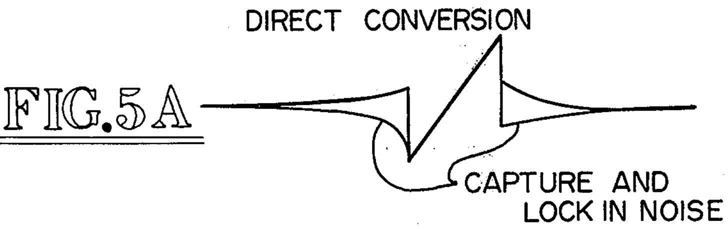
5B
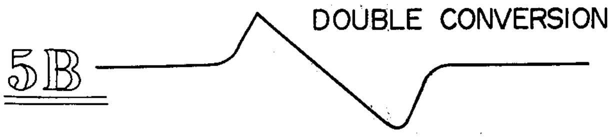
5C
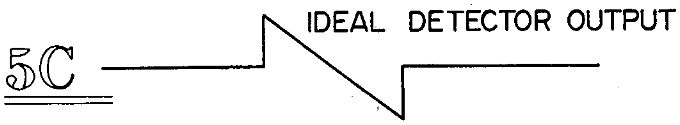

INTEGRATED FREQUENCY SELECTIVE DEMODULATION CIRCUIT

BACKGROUND OF THE INVENTION

The present invention is directed to an integrated frequency selective demodulator circuit and more specifically to a circuit utilizing a phase locked loop.

The use of a phase locked loop as a FM discriminator or detector is now well recognized. Such phase locked loop (PLL) is either directly coupled to the RF amplifier to form an FM receiver or alternatively demodulates the intermediate frequency of the FM receiver. In either case, however, the phase locked loop must operate at either the RF or IF frequency of the receiver. When it is desired to utilize a monolithic or integrated PLL, characteristics of the PLL such as temperature drift greatly deteriorate at higher frequency operating ranges. Thus, in the present state of the art the use of a phase locked loop as an FM discriminator in many applications has been severely restricted.

OBJECT AND SUMMARY OF THE INVENTION

It is, therefore, an object of the present invention to provide a frequency selective demodulator circuit for demodulating an FM input signal which utilizes an integrated phase locked loop, the frequency selective circuit being capable of effectively demodulating relatively high FM input signal frequencies.

In accordance with the above object there is provided an integrated selective demodulator circuit for demodulating an FM input signal having a fixed carrier frequency. A frequency oscillator of fixed frequency is provided. A first mixer mixes the FM input signal with the oscillator frequency to provide an FM difference signal having a carrier frequency substantially less than the input signal carrier frequency. A phase locked loop detector is coupled to the first mixer and demodulates the FM difference signal. The PLL detector includes a second mixer and a voltage controlled oscillator for providing an output signal to said second mixer for tracking the difference signal. A semiconductive substrate is provided in which the mixer and PLL are integrated. The VCO has a free running frequency determined exclusively by non-alignable components integrated into the substrate.

BRIEF DESCRIPTION OF THE DRAWINGS

FIG. 4 shows characteristic curves useful in understanding one of the advantages of the present invention; and FIGS. 5A – 5C are curves useful in understanding the invention.

DETAILED DESCRIPTION OF THE PREFERRED EMBODIMENT

Figure 1:
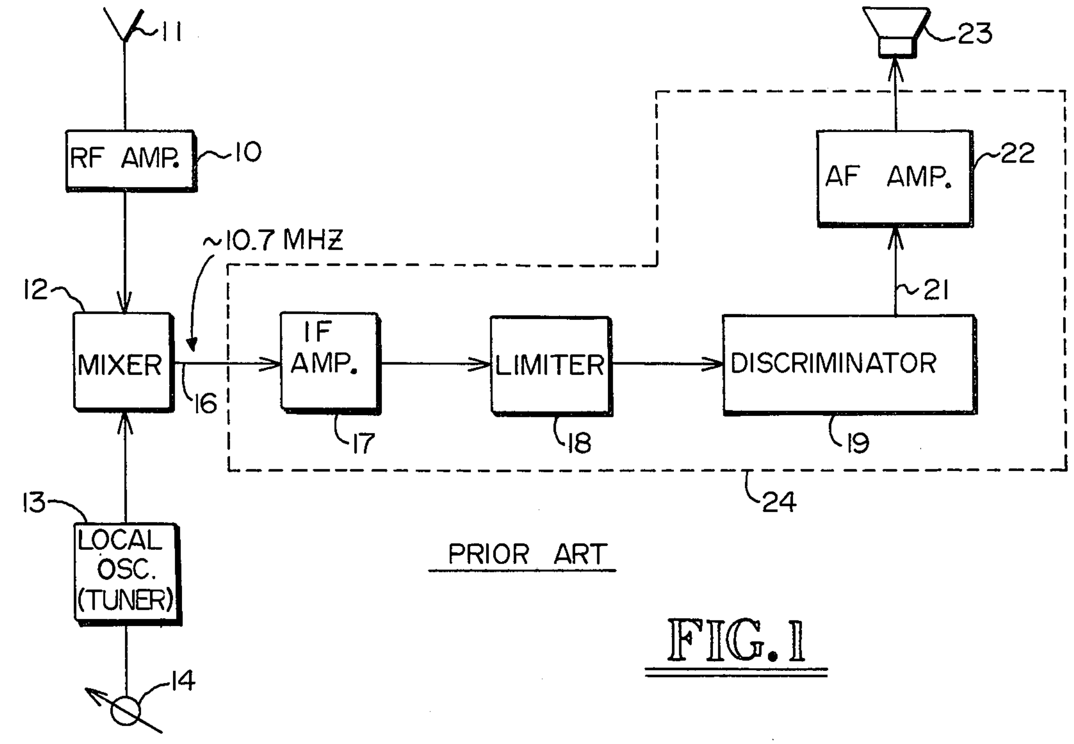
FIG. 1 is a block diagram of a typical FM receiver.

FIG. 1 illustrates a typical FM superheterodyne receiver in which a radio frequency amplifier 10 receives an FM signal from an antenna 11 and couples it to a mixer 12. Also coupled to the mixer is a local oscillator 13 which is variable by a control 14 to produce an intermediate frequency on line 16 which in the typical FM receiver case would be 10.7 MHz. The signal is coupled to an intermediate frequency amplifier 17, a limiter 18, a discriminator 19 which demodulates the signal to produce an audio signal on line 21 which is then amplified by audio frequency amplifier 22 coupled to loudspeaker 23.

Figure 2:
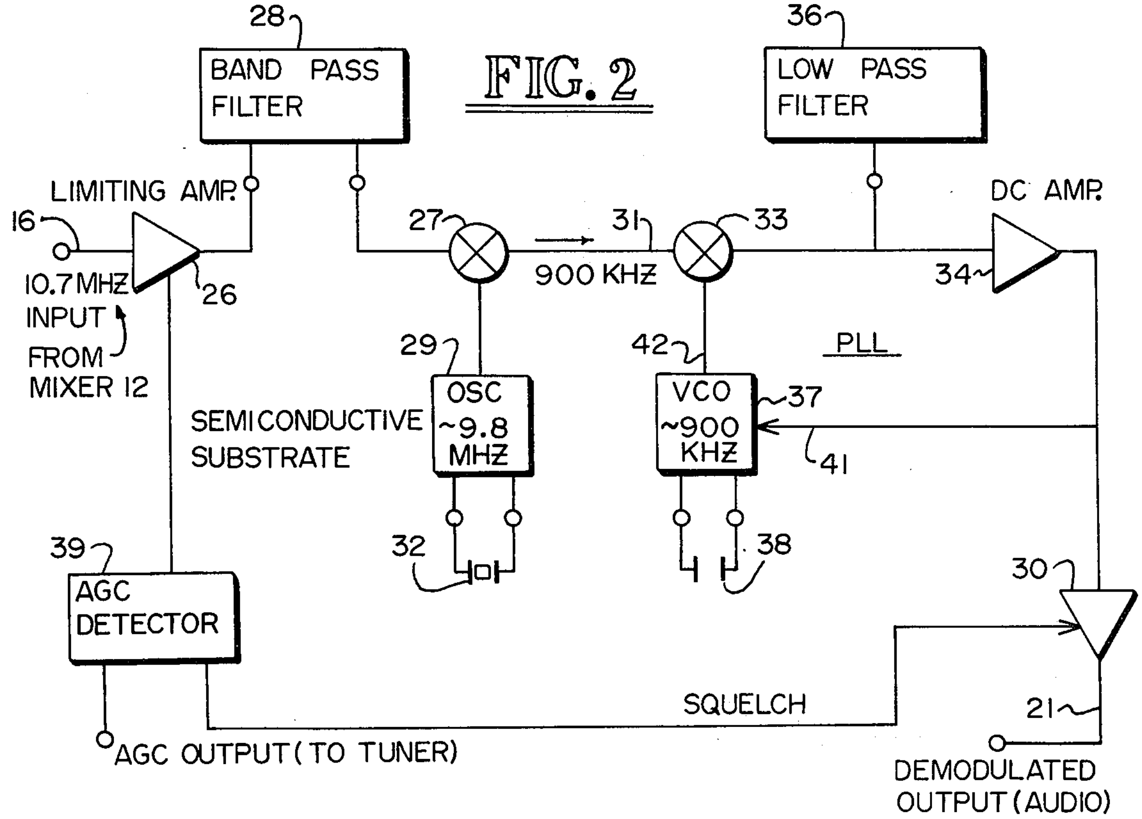
FIG. 2 is a block diagram of a portion of such receiver incorporating the present invention.

The present invention modifies the dashed block 24 surrounding components 17 through 22 and is illustrated in FIG. 2. It is in the form of an integrated circuit where all of the components are integrated on a single semiconductive substrate or chip except for the circled connections which denote a connection external to the integrated circuit package.

Referring now specifically to FIG. 2, a limiting amplifier 26 receives on its input terminal 16 an FM input signal having a fixed carrier frequency which in the case of the present invention is the IF signal. The output of amplifier 26 is coupled to a first mixer 27 through an external bandpass filter 28. The FM input signal to mixer 27 is mixed with the signal from an oscillator 29, which in the preferred embodiment is approximately 9.8 MHz, to produce a difference signal on line 31 having a carrier frequency of 900 kHz. Oscillator 29 is crystal controlled to produce the 9.8 MHz frequency by means of the externally connected crystal 32.

A phase locked loop detector is coupled to line 31 for demodulating the FM signal coupling it to the audio amplifier 30 to produce the demodulated output. The phase locked loop includes a second mixer 33 connected to a dc amplifier 34 through an externally connected low pass filter 36. The feedback path is closed in the phase locked loop through voltage controlled oscillator 37 which by means of externally connected capacitor 38 has a frequency centered on the 900 kHz carrier frequency on line 31. Thus, its tracking range is also centered on this 900 kHz difference signal.

An automatic gain control (AGC) detector 39 is coupled to limiting amplifier 26 and provides a squelch input to audio amplifier 30 and an AGC output to the local oscillator or tuner 13 as illustrated in FIG. 1.

Thus, the circuit of FIG. 2 when substituted in the typical FM receiver as illustrated in FIG. 1 comprises a triple conversion receiver. That is, for example, a 100 MHz input signal is amplified and mixed down to 10.7 MHz in the front end of the receiver which is thereafter mixed two more times in the integrated circuit of the present invention. Hence, a triple conversion system results. This has the significant and unexpected result of greater frequency selectivity, better signal to noise ratio and better dc stability. This is in comparison to the use of a standard phase locked loop integrated circuit in the discriminator block 19 of FIG. 1.

Figure 3:
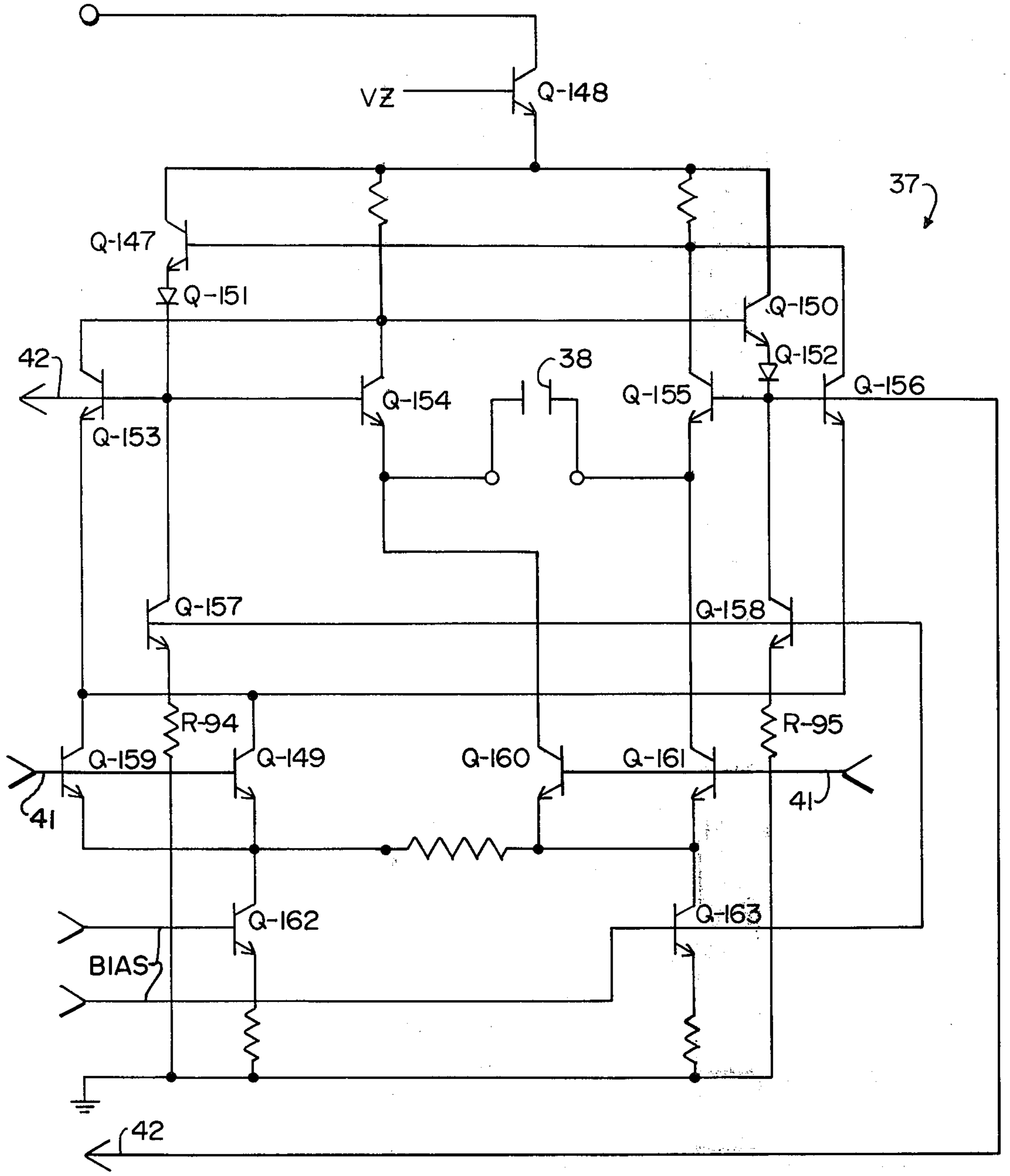
FIG. 3 is a circuit schematic of a portion of FIG. 2.

Integrated or monolithic phase locked loop circuits normally are limited to operation under 50 MHz. This is because there may be significant frequency drifts due to temperature change. The VCO of the PLL is very temperature dependent. By converting the amplified input signal to a significantly lower frequency such as 900 KHz, the frequency stability of the voltage controlled oscillator (VCO) of the phase locked loop as temperature varies is enhanced. In fact, the VCO can now be constructed exclusively of non-alignable components to greatly simplify circuit design and cost. From a practical standpoint this makes possible the effective use of PLLs in radio receivers. FIG. 3 illustrates in detail VCO 37 of FIG. 1 with its complementary output signal on lines 42 and its complementary dc input control signal on lines 41. Transistors Q147–161 form a cross-coupled multivibrator. Q162, 163 are current sources which are appropriately biased. Such multivibrator is similar to that shown in U.S. Pat. No. 3,582,809.

In the prior art, VCO 37 would include alignment means such as a variable capacitor 38 and/or a potentiometer on the inputs 41. The present invention eliminates the need for such modifications.

Another side advantage is that the down conversion process increases the deviation of the input signal by a fraction dependent upon the down conversion to also increase the signal to noise ratio of the demodulated signal since this ratio is proportional to deviation. As illustrated in FIG. 4 the normal deviation at 900 KHz is ±10% as compared to 10.7 MHz of ±1%. Since the background residual noise is constant the signal to noise ratio is increased by a factor of ten. Finally, AM rejection characteristics are also greatly improved by the use of the limiting amplifier 26.

Additional benefit is also the change in capture and lock noise produced when the loop starts locking or unlocking to a signal. This is demonstrated in FIGS. 5A – 5C which shows the capture and lock noise of the "S" curve. The behavior of the double conversion comes close to the ideal detector.

We claim:

1. An integrated frequency selective demodulator circuit for demodulating a frequency modulated (FM) input signal having a fixed carrier frequency comprising: a frequency oscillator of fixed frequency, a first mixer for mixing said FM input signal with said oscillator frequency to provide an FM difference signal having a carrier frequency substantially less than said input signal carrier frequency; a phase-locked loop (PLL) detector coupled to said first mixer and demodulating said FM difference signal said PLL detector including a second mixer, filtering means coupled to the output of said second mixer and providing a filtered output serving as a frequency control signal and a voltage controlled oscillator (VCO) coupled between the output of said filtering means and said second mixer for providing an output signal to said second mixer for tracking said difference signal said VCO having a fixed value timing capacitor; a semiconductive substrate in which said first mixer and said PLL detector are integrated, said VCO having a free running frequency determined exclusively by fixed value components which are substantially integrated into said substrate and by said fixed value timing capacitor which is external to said substrate; and audio amplifier means for amplifying said frequency control signal.

2. A circuit as in claim 1 where said fixed frequency oscillator is crystal controlled.

3. A frequency modulation (FM) receiver for receiving and demodulating a frequency band of FM signals comprising: antenna means for receiving said FM signals; means including a variable local oscillator coupled to said antenna means for providing a fixed intermediate frequency FM input signal; and an integrated frequency selective demodulator circuit for demodulating said FM input signal having a fixed carrier frequency including a crystal controlled oscillator of fixed frequency, a first mixer for mixing said FM input signal with said oscillator frequency to provide an FM difference signal having a carrier frequency substantially less than said input signal carrier frequency, a phase-locked loop (PLL) detector coupled to said first mixer and demodulating said FM difference signal said PLL detector including a second mixer, filtering means coupled to the output of said second mixer and providing a filtered output serving as a frequency control signal and a voltage controlled oscillator (VCO) coupled between the output of said filtering means and said second mixer for providing an output signal to said second mixer for tracking said difference signal said VCO having a fixed value timing capacitor; a semiconductive substrate in which said first mixer and said PLL detector are integrated said VCO having a free running frequency determined exclusively by fixed value components which are substantially integrated into said substrate and by said fixed value timing capacitor which is external to said substrate; and audio amplifier means for amplifying said frequency control signal.

* * * * *